US012610790B2

(12) United States Patent
Sun et al.

(10) Patent No.: US 12,610,790 B2
(45) Date of Patent: Apr. 21, 2026

(54) STRUCTURE INCLUDING A PHOTORESIST UNDERLAYER AND METHOD OF FORMING SAME

(71) Applicant: ASM IP Holding B.V., Almere (NL)

(72) Inventors: Yiting Sun, Leuven (BE); David de Roest, Kessel-Lo (BE); Daniele Piumi, Etterbeek (BE); Ivo Johannes Raaijmakers, Almere (NL); BokHeon Kim, San Jose, CA (US); Timothee Blanquart, Oud-Heverlee (BE); Yoann Tomczak, Leuven (BE)

(73) Assignee: ASM IP Holding B.V., Almere (NL)

( * ) Notice: Subject to any disclaimer, the term of this patent is extended or adjusted under 35 U.S.C. 154(b) by 782 days.

(21) Appl. No.: 16/922,520

(22) Filed: Jul. 7, 2020

(65) Prior Publication Data

US 2021/0013037 A1     Jan. 14, 2021

Related U.S. Application Data

(60) Provisional application No. 62/872,239, filed on Jul. 9, 2019.

(51) Int. Cl.
| | |
|---|---|
| *H01L 21/033* | (2006.01) |
| *G03C 1/74* | (2006.01) |
| *G03F 7/00* | (2006.01) |
| *G03F 7/004* | (2006.01) |
| *G03F 7/09* | (2006.01) |
| *G03F 7/095* | (2006.01) |
| *G03F 7/16* | (2006.01) |
| *G03F 7/38* | (2006.01) |
| *H01L 21/311* | (2006.01) |

(52) U.S. Cl.
CPC ............ *H01L 21/0332* (2013.01); *G03C 1/74* (2013.01); *G03F 7/004* (2013.01); *G03F 7/094* (2013.01); *G03F 7/095* (2013.01); *G03F 7/167* (2013.01); *G03F 7/38* (2013.01); *G03F 7/70033* (2013.01); *H01L 21/31144* (2013.01)

(58) Field of Classification Search
CPC ...................................................... G03F 7/167
See application file for complete search history.

(56) References Cited

U.S. PATENT DOCUMENTS

| | | | | |
|---|---|---|---|---|
| 11,644,758 B2 * | 5/2023 | Piumi | ................. | H01L 21/0332 |
| | | | | 430/313 |
| 12,055,863 B2 * | 8/2024 | Piumi | ................. | H01L 21/3081 |
| 2004/0198065 A1 * | 10/2004 | Lee | ...................... | H01L 21/3081 |
| | | | | 257/E21.232 |
| 2006/0286814 A1 * | 12/2006 | Kumada | ........... | H01L 21/76834 |
| | | | | 257/14 |
| 2013/0292835 A1 * | 11/2013 | King | ..................... | H01L 21/022 |
| | | | | 438/622 |
| 2014/0239462 A1 * | 8/2014 | Shamma | ................. | G03F 7/094 |
| | | | | 29/25.01 |

(Continued)

*Primary Examiner* — James M Mellott
(74) *Attorney, Agent, or Firm* — Snell & Wilmer L.L.P.

(57) ABSTRACT

Methods of forming structures including a photoresist underlayer and structures including the photoresist underlayer are disclosed. Exemplary methods include forming the photoresist underlayer using one or more of plasma-enhanced cyclic (e.g., atomic layer) deposition and plasma-enhanced chemical vapor deposition. Surface properties of the photoresist underlayer can be manipulated using a treatment process.

20 Claims, 8 Drawing Sheets

(56)                     References Cited

U.S. PATENT DOCUMENTS

2014/0356549 A1* 12/2014 Varadarajan ...... H01L 21/02216
                                                        427/249.15
2014/0367751 A1* 12/2014 Yu .......................... H10D 30/62
                                                        438/585
2015/0364371 A1* 12/2015 Yen .................... H10D 84/0149
                                                        438/666
2018/0120278 A1*  5/2018 Hoorfar ............. G01N 33/0031
2020/0176267 A1*  6/2020 Hsiao ............... H01L 21/76814

* cited by examiner

Pattern transfer by dry etch

1302 Provide Substrate

1304 Form Photoresist Underlayer

1306 Treatment

1308 Form Photoresist Layer

STRUCTURE INCLUDING A PHOTORESIST UNDERLAYER AND METHOD OF FORMING SAME

CROSS-REFERENCE TO RELATED APPLICATIONS

This application claims priority to U.S. Provisional Patent Application Ser. No. 62/872,239 filed Jul. 9, 2019 titled STRUCTURE INCLUDING A PHOTORESIST UNDER-LAYER AND METHOD OF FORMING SAME, the disclosures of which are hereby incorporated by reference in their entirety.

FIELD OF INVENTION

The present disclosure generally relates to structures and to methods of forming the structures. More particularly, the disclosure relates to structures including a photoresist underlayer and to methods of forming such structures.

BACKGROUND OF THE DISCLOSURE

During the manufacture of electronic devices, fine patterns of features can be formed on a surface of a substrate by patterning the surface of the substrate and etching material from the substrate surface using, for example, gas-phase etching processes. As a density of devices on a substrate increases, it becomes increasingly desirable to form features with smaller dimensions.

Photoresist is often used to pattern a surface of a substrate prior to etching. A pattern can be formed in the photoresist, by applying a layer of photoresist to a surface of the substrate, masking the surface of the photoresist, exposing the unmasked portions of the photoresist to radiation, such as ultraviolet light, and removing a portion (e.g., the unmasked or masked portion) of the photoresist, while leaving a portion of the photoresist on the substrate surface.

Recently, techniques have been developed to use extreme ultraviolet (EUV) wavelengths to develop patterns having relatively small pattern features (e.g., 10 nm or less). To form features on a substrate using EUV, a photoresist underlayer of spin-on glass (SOG) is typically deposited onto a surface of a substrate, and then an EUV photoresist layer is deposited overlying the SOG underlayer. Typically, the underlayer has a thickness of about 10 nm or more.

As device feature sizes decrease, the underlayer may be desirably thinner to, for example, allow formation of etched features having desired pitch resolution and/or aspect ratios. Unfortunately, it can be difficult to deposit SOG at a thickness of less than 10 nm. Further, a within substrate and substrate-to-substrate thickness non-uniformity of deposited SOG can be undesirably high, particularly as a target thickness of the SOC layer is reduced. For at least these reasons, improved structures including a photoresist underlayer, such as an underlayer suitable for use with EUV, and methods of forming such structures are desired.

Any discussion of problems and solutions set forth in this section has been included in this disclosure solely for the purpose of providing a context for the present disclosure and should not be taken as an admission that any or all of the discussion was known at the time the invention was made.

The following prior art documents are made of record: .De Silva, A.; Dutta, A.; Meli, L.; Yao, Y.; Mignot, Y.; Guo, J.; Felix, N. Inorganic Hardmask Development For Extreme Ultraviolet Patterning. Journal of Micro/Nanolithography, MEMS, and MOEMS 2018, 18, 1; Felix, N.; Singh, L.;

Seshadri, I.; Silva, A.; Meli, L.; Liu, C.; Chi, C.; Guo, J.; Truang, H.; Schmidt, K. et al. Ultrathin Extreme Ultraviolet Patterning Stack Using Polymer Brush As An Adhesion Promotion Layer. Journal of Micro/Nanolithography, MEMS, and MOEMS 2017, 16, 1; Tatehaba, Y. Adhesion energy of polystyrene in function water, In 5th International Symposium of Cleaning Technology in Semiconductor Device Manufacturing; 1998; pp. 560-565; Fallica, R.; Stowers, J.; Grenville, A.; Frommhold, A.; Robinson, A.; Ekinci, Y. Dynamic Absorption Coefficients Of Chemically Amplified Resists And Nonchemically Amplified Resists At Extreme Ultraviolet. Journal of Micro/Nanolithography, MEMS, and MOEMS 2016, 15, 033506.

SUMMARY OF THE DISCLOSURE

Various embodiments of the present disclosure relate to structures including improved photoresist underlayers (sometimes referred to as adhesion layers) and to methods of forming the layers and structures. While the ways in which various embodiments of the present disclosure address drawbacks of prior methods and structures are discussed in more detail below, in general, various embodiments of the disclosure provide structures that can include a relatively thin, uniform photoresist underlayer with desired properties, such as desired etch selectivity, pattern quality, and/or stability.

In accordance with at least one embodiment of the disclosure, a method of forming a structure includes providing a substrate, forming a photoresist underlayer overlying a surface of the substrate, and forming a layer of photoresist overlying the photoresist underlayer. The photoresist underlayer can be formed using one or more of plasma-enhanced cyclic (e.g., atomic layer) deposition and plasma-enhanced chemical vapor deposition. The photoresist underlayer can have a thickness of less than 10 nm or less than 5 nm. The photoresist layer can be or include extreme ultraviolet (EUV) lithography photoresist. The step of forming the photoresist underlayer can include providing a precursor comprising oxygen, silicon, hydrogen, and at least one organic group. For example, the precursor can include at least one silicon-oxygen bond. Additionally or alternatively, the precursor can include at least one silicon-R bond, wherein R is selected from, for example, one or more of the group consisting of alkyl (e.g., methyl group), alkenyl, alkynyl, aryl, alkoxy (e.g., —OCH$_3$, —OCH$_2$CH$_3$), Sylil, halogen and hydrogen. In some cases, the precursor includes at least two organic groups or at least one organic group and at least one halogen. By way of particular examples, the precursor can include one or more of dimethyldimethoxysi-lane, dimethoxytetramethyldisiloxane, octamethylcyclo-tetrasiloxane, tetramethylcyclotetrasiloxane (TMCTS), trimethylsilane (3MS), and diethoxymethylsilane (DEMS). Precursors with a di- tri- or tetrasilane backbone may also be beneficial, especially for thin films. A co-reactant used during the formation of the photoresist underlayer can be selected from one or more of the group consisting of Ar, He, O$_2$, CO$_2$, CO, H$_2$, N$_2$O, H$_2$O, N$_2$, and NH$_3$. A temperature within a reaction space during the step of forming the photoresist underlayer can be, for example, between about 20° C. and about 200° C. or between about 150° C. and about 350° C. In some cases, the photoresist underlayer can be exposed to a post-deposition treatment step that includes formation of a plasma. In these cases, the plasma treatment step can include exposure of the photoresist underlayer to species activated using a direct and/or remote plasma. The plasma treatment step can include forming activated species from a gas including one or more of Hz, $O_2$, $CO_2$, CO, $N_2O$, $NF_3$, and $C_xH_yF_z$, where x>=1, y>=0, and z>=0.

In accordance with exemplary aspects of embodiments of the disclosure, the photoresist underlayer can be selected and/or formulated to have desired properties—e.g., surface energy properties. For example, exemplary methods can include determining surface energy components, i.e., a polar part of surface energy and/or a disperse part of surface energy, of the photoresist and/or the photoresist underlayer. The desired underlayer properties can depend on the type of photoresist (e.g., negative or positive tone EUV photoresist) and/or the surface energy properties of the photoresist. By way of examples, when the photoresist is positive tone photoresist, a value of the polar part of surface energy of the photoresist underlayer can be between about 0 to about 15 mN/m. When the photoresist is negative tone photoresist, a value of the polar part of surface energy of the photoresist underlayer can be within about –20% to about +20% percent of a value of a polar part of surface energy of the photoresist.

In accordance with at least one other embodiment of the disclosure, a structure includes a photoresist underlayer. The photoresist underlayer can be formed using a method as described herein. The photoresist underlayer can include, for example, a layer comprising SiOCH, such as SiOCNH. The photoresist underlayer can have surface energy properties as described herein. Exemplary structures can also include a layer of photoresist, such as negative tone or positive tone EUV photoresist.

Further described is a method of forming a structure. The method comprises the steps of: providing a substrate; forming a photoresist underlayer overlying a surface of the substrate; and forming a photoresist layer overlying the photoresist underlayer. The photoresist underlayer is formed using one or more of plasma-enhanced atomic layer deposition and plasma-enhanced chemical vapor deposition.

In some embodiments, the photoresist layer comprises extreme ultraviolet (EUV) lithography photoresist.

In some embodiments, the step of forming the photoresist underlayer comprises providing a precursor comprising oxygen, silicon, hydrogen, and at least one organic group.

In some embodiments, the precursor comprises at least one silicon-oxygen bond.

In some embodiments, the precursor comprises at least one silicon-R bond, wherein R is selected from one or more of the group consisting of an alkyl, alkenyl, alkynyl, aryl, alkoxy, halogen, and hydrogen.

In some embodiments, the at least one organic group comprises at least two organic groups.

In some embodiments, the precursor comprises one or more selected from the group consisting of: dimethyldimethoxysilane, dimethoxytetramethyldisiloxane, and octamethylcyclotetrasiloxane, tetramethylcyclotetrasiloxane (TMCTS), trimethylsilane (3MS), and diethoxymethylsilane (DEMS).

In some embodiments, the step of forming the photoresist underlayer comprises providing one or more of a reactant and a co-reactant selected from one or more from the group consisting of: Ar, He, $O_2$, $CO_2$, CO, Hz, $N_2O$, $H_2O$, $N_2$, $NH_3$.

In some embodiments, the method comprises a step of determining a polar part of surface energy of the photoresist underlayer.

In some embodiments, the photoresist layer comprises positive tone photoresist and a value of the polar part of surface energy of the photoresist underlayer is between about 0 to about 15 mN/m.

In some embodiments, the photoresist layer comprises negative tone photoresist and a value of the polar part of surface energy of the photoresist underlayer is within about –20% to about +20% percent of a value of a polar part of surface energy of the photoresist layer.

In some embodiments, the method further comprises a step of determining a disperse part of surface energy of the photoresist underlayer.

In some embodiments, a thickness of the photoresist underlayer is less than 5 nm.

In some embodiments, a temperature within a reaction space during the step of forming the photoresist underlayer is between about 20° C. and about 200° C.

In some embodiments, a temperature within a reaction space during the step of forming the photoresist underlayer is between about 150° C. and about 350° C.

In some embodiments, the method further comprises a step of exposing the photoresist underlayer to a plasma treatment step.

In some embodiments, the plasma treatment step comprises exposure of the photoresist underlayer to species activated using a direct plasma.

In some embodiments, the plasma treatment step comprises exposure of the photoresist underlayer to species activated using a remote plasma.

In some embodiments, the plasma treatment step comprises forming activated species from one or more of Hz, $O_2$, $CO_2$, CO, $N_2O$, $NF_3$, $C_xH_yF_z$ (x>=1, y>=0, z>=0).

Further described herein is a structure formed according to a method as described herein.

In some embodiments, the photoresist underlayer comprises SiOC.

In some embodiments, the photoresist underlayer comprises SiOCN.

In some embodiments, the photoresist layer comprises positive tone photoresist and a value of a polar part of surface energy of the photoresist underlayer is between about 0 to about 15 mN/m.

In some embodiments, the photoresist layer comprises negative tone photoresist and a value of a polar part of surface energy of the photoresist underlayer is between about –20% to about +20% percent of a value of a polar part of surface energy of the photoresist layer.

Further described herein is a method for applying a pre-treatment for a photoresist deposition step, the method comprising the steps: providing a substrate to a reaction chamber; and, depositing an underlayer on the substrate. The underlayer may have a thickness of less than 5 nm. The underlayer may have a surface energy having a polar part and a dispersive part, wherein polar part of the surface energy is from at least 3 mN/m to at most 13 mN/m.

In some embodiments, the dispersive part of the surface energy is from at least from at least 26 mN/m to at most 31 mN/m.

In some embodiments, the dispersive and polar parts of the surface energy are determined by means of the Owens, Wendt, Rabel and Kaelble (OWRK) method.

In some embodiments, the underlayer comprises silicon, oxygen, and carbon. In some embodiments, the underlayer comprises silicon, oxygen, hydrogen, and carbon.

In some embodiments, the underlayer further comprises nitrogen.

In some embodiments, the method further comprises a step of exposing the underlayer to a plasma, the plasma comprising one or more elements selected from the list consisting of chlorine, oxygen, hydrogen, and nitrogen.

In some embodiments, and while the underlayer is being exposed to the plasma, a precursor comprising silicon, hydrogen, and at least one organic group is provided to the reaction chamber.

In some embodiments, the precursor is selected from the list consisting of dimethyldimethoxysilane, dimethoxyte-tramethyldisiloxane, octamethylcyclotetrasiloxane (OMCTS), tetramethylcyclotetrasiloxane (TMCTS), trimethylsilane (3MS), and diethoxymethylsilane (DEMS).

In some embodiments, the precursor is provided in pulses.

In some embodiments, the plasma further comprises a noble gas.

In some embodiments, the underlayer comprises a bilayer structure comprising an upper underlayer part and a lower underlayer part, and the lower underlayer part comprises a metal or metalloid.

Further described is a system comprising one or more reaction chambers configured for carrying out a method for applying a pre-treatment for a photoresist deposition step as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIGS. 7-12 illustrate structures formed using negative tone photoresist in accordance with at least one embodiment of the disclosure.

Figure 16:
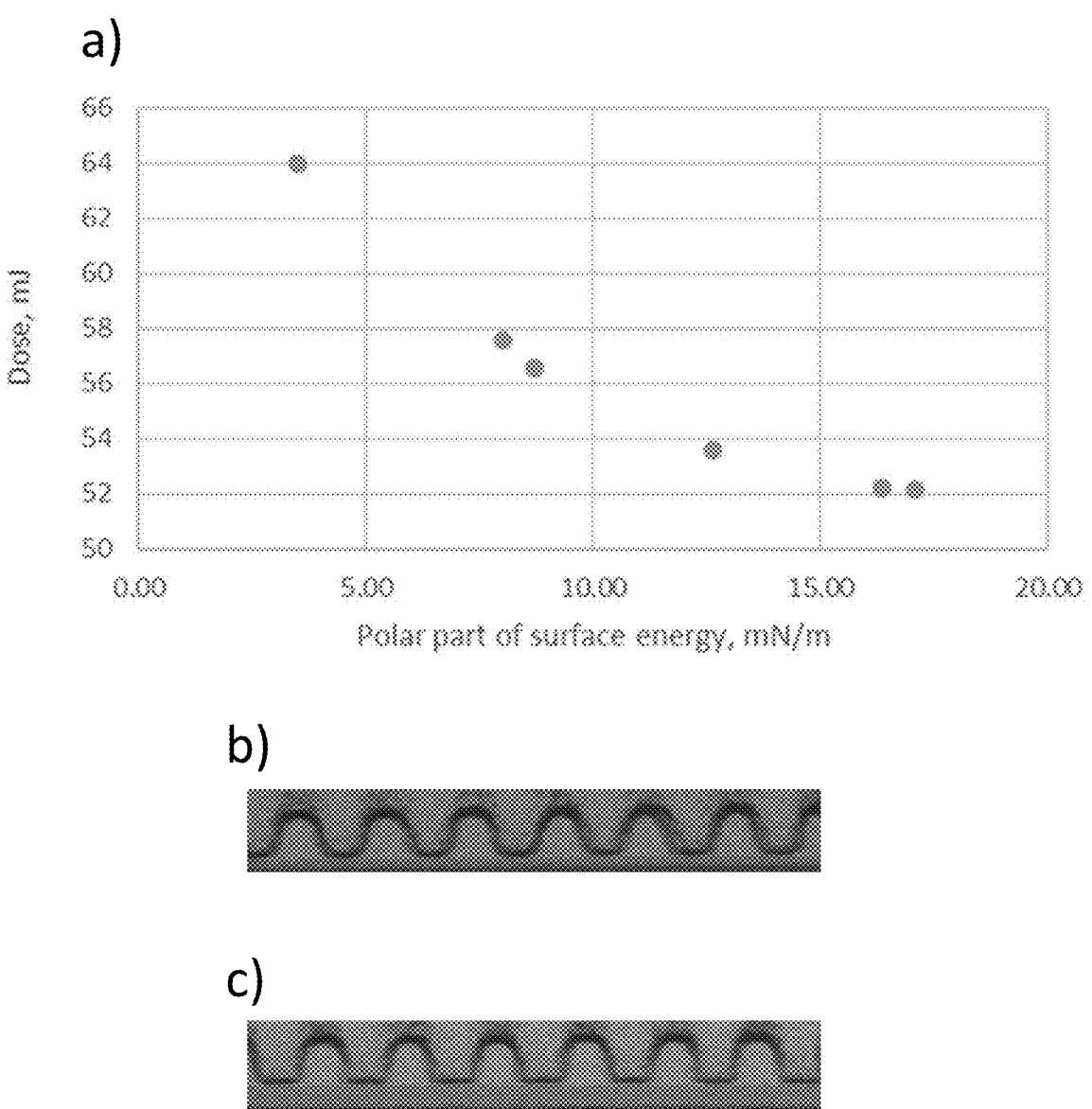

FIG. 16 illustrates panel a) EUV dose for full development as a function of the polar part of the surface energy of the underlayer; panel b) a developed underlayer-resist stack of which the underlayer has a relatively low polar part of the surface energy, which features imperfect development; panel c) a developed underlayer-resist stack of which the underlayer has a relatively high polar part of the surface energy, which results in improved development.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming structures that include a photoresist underlayer and to structures including a photoresist underlayer. As described in more detail below, exemplary methods can be used to form structures with photoresist underlayers that provide desired properties, such as desired thickness (e.g., less than 10 or less than 5 nm), relatively low surface roughness, good adhesion to the photoresist, desired etch selectivity, desired thickness uniformity—both within a substrate (e.g., a wafer) and between substrates, high pattern quality (low number of defects and high pattern fidelity), low line width roughness (LWR), stability during EUV lithography processing—e.g., during any post-exposure bake (PEB), photoresist development, reworking of the substrate, reasonable EUV sensitivity, and compatible with integration (i.e., under the deposition condition of underlayer, other layers underneath shall not be damaged—e.g., not too high deposition temperature). The present photoresist underlayers may further offer the possibility of being selectively etched versus resist. The present photoresist underlayers may further be used in combination with layers such as spin-on carbon (SOC), carbon hardmask (CHM) or amorphous carbon (APF) layers that may be selectively etched versus the underlayers as described herein. The present underlayers may further resist baking steps, and have a low or even negligible etch rate when exposed to developers such as Tetramethylammonium hydroxide (TMAH).

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate.

In some embodiments, "film" refers to a layer extending in a direction perpendicular to a thickness direction to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments. Percentages set forth herein are absolute percentages, unless otherwise noted.

Figures 1, 2, 3:
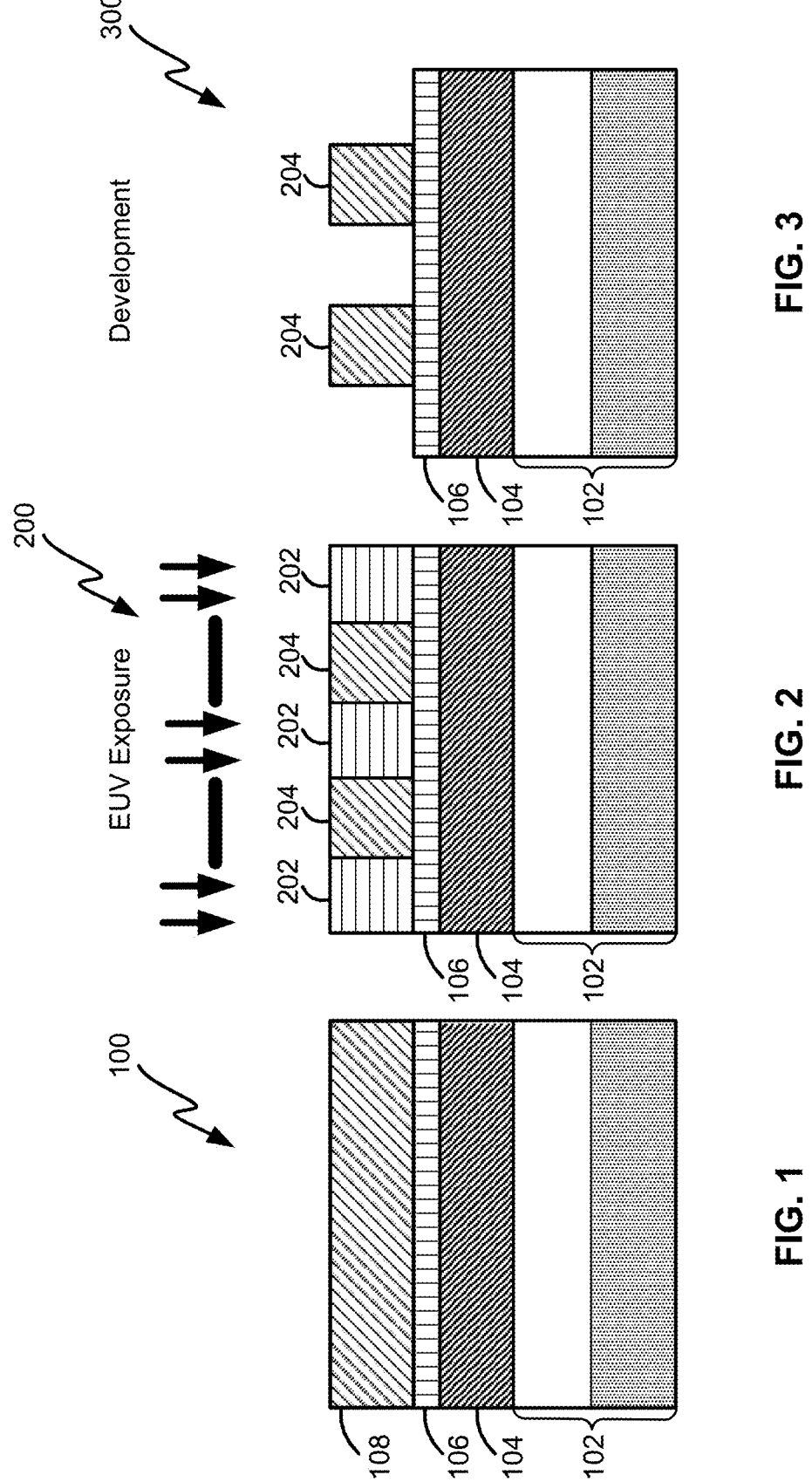
FIGS. 1-6 illustrate structures formed using positive tone photoresist in accordance with at least one embodiment of the disclosure.

Turning now to the figures, FIG. 1 illustrates a structure 100 in accordance with exemplary embodiments of the disclosure. Structure 100 includes a substrate 102, a material layer 104, a photoresist underlayer 106, and a positive tone EUV photoresist layer 108.

Substrate 102 can include a substrate as described above. By way of example, substrate 102 can include a semiconductor substrate, such as a bulk material, such as silicon (e.g., single-crystal silicon), other Group IV semiconductor material, Group III-V semiconductor material, and/or Group II-VI semiconductor material and can include one or more layers overlying the bulk material. Further, as noted above, the substrate can include various topologies, such as recesses, lines, and the like formed within or on at least a portion of a layer of the substrate.

Material layer 104 is optional. When included, material layer 104 can include, for example, an oxide, such as a native oxide, amorphous carbon, or a field oxide. Other exemplary layers include nitrides, other oxides, silicon, and add-on films (e.g. a self-assembled monolayer (e.g., hexamethyldisilazane (HMDS)). Material layer 104 can be subjected to a plasma treatment as described herein and/or dry and/or wet etch process(es).

Photoresist underlayer 106 can include a photoresist underlayer formed in accordance with a method described herein and/or have properties as described herein. A thickness of photoresist underlayer can depend on the thickness of material layer 104 (or the thickness of substrate 102) to be etched, a type of photoresist, and the like. In accordance with examples of the disclosure, photoresist underlayer 106 has a thickness of less than 10 nm or less than or about 5 nm. In some embodiments, photoresist underlayer has a thickness of from at least 1.0 nm to at most 2.0 nm, or from at least 2.0 nm to at most 5.0 nm, or from at least 5.0 nm to at most 10.0 nm. If photoresist underlayer 106 is too thick, residual underlayer material may remain after an etch step, described in connection with FIGS. 4 and 5. If photoresist underlayer 106 is too thin, photoresist underlayer 106 may not provide desired pattern transfer during an etch process. This notwithstanding, the underlayers which are disclosed herein may provide excellent pattern transfer even though they can be very thin. A surface of photoresist underlayer 106 may or may not be treated with a plasma treatment, to provide desired surface terminations to, for example, promote adhesion with photoresist layer 108. Alternatively, and in some embodiments, the plasma treatment may be used to reduce adhesion with a photoresist layer 108, since excessive adhesion tends to be undesirable since it may cause resist residuals remaining on the substrate in exposed areas, an effect called scumming.

One mechanism which may cause scumming to occur when certain underlayers is the occurrence electron donors groups (i.e. functional groups acting as Lewis bases). Those electron donors might neutralize acid generated by a photoacid generator in resist after EUV exposure and cause the resist near the underlayer not fully developed. This undesirable effect may be called underlayer poisoning. With a further plasma treatment step, additional bonds and/or functional groups can be introduced to decrease the adhesion between the underlayer and the photoresist, making the resist "less adhering" and offset a possible effect of underlayer poisoning as described above, which can cause insufficient resist removal after development when adhesion between photoresist and underlayer is too strong.

In some embodiments, the underlayer comprises a material selected from the list consisting of amorphous carbon, octadecyltrichlorosilane, and dimethyldimethoxysilane.

In accordance with examples of the disclosure, photoresist underlayer 106 comprises SiOC. As used herein, unless stated otherwise, SiOC is not intended to limit, restrict, or define the bonding or chemical state, for example, the oxidation state of any of Si, O, C, and/or any other element in the film. Further, in some embodiments, SiOC thin films may comprise one or more elements in addition to Si, O, and/or C, such as H or N. In some embodiments, the SiOC films may comprise Si—C bonds and/or Si—O bonds. In some embodiments, the SiOC films may comprise Si—C bonds and Si—O bonds and may not comprise Si—N bonds. In some embodiments, the SiOC films may comprise Si—H bonds in addition to Si—C and/or Si—O bonds. In some embodiments, the SiOC films may comprise more Si—O bonds than Si—C bonds, for example, a ratio of Si—O bonds to Si—C bonds may be from about 1:10 to about 10:1. In some embodiments, the SiOC may comprise from about 0% to about 50% carbon on an atomic basis. In some embodiments, the SiOC may comprise from about 0.1% to about 40%, from about 0.5% to about 30%, from about 1% to about 30%, or from about 5% to about 20% carbon on an atomic basis. In some embodiments, the SiOC films may comprise from about 0% to about 70% oxygen on an atomic basis. In some embodiments, the SiOC may comprise from about 10% to about 70%, from about 15% to about 50%, or from about 20% to about 40% oxygen on an atomic basis. In some embodiments, the SiOC films may comprise about 0% to about 50% silicon on an atomic basis. In some embodiments, the SiOC may comprise from about 10% to about 50%, from about 15% to about 40%, or from about 20% to about 35% silicon on an atomic basis. In some embodiments, the SiOC may comprise from about 0.1% to about 40%, from about 0.5% to about 30%, from about 1% to about 30%, or from about 5% to about 20% hydrogen on an atomic basis. In some embodiments, the SiOC films may not comprise nitrogen. In some other embodiments, the SiOC films may comprise from about 0% to about 40% nitrogen on an atomic basis (at %). By way of particular examples, SiOC films can be or include a layer comprising SiOCH, such as SiOCNH. Advantageously, the SiOC films may be non-porous.

Photoresist underlayer 106 desirably exhibits good adhesion and other properties as described herein. To provide desired adhesion between photoresist layer 108 and photoresist underlayer 106, photoresist underlayer 106 may have or be tuned to have desired surface chemistry properties, e.g., quantified as surface energy, which is further categorized into a polar part of surface energy and a disperse part of surface energy. The polar part of surface energy and the disperse part of surface energy of photoresist underlayer 106 can be calculated by measuring a contact angle of a liquid, such as water or $CH_2I_2$, and using the Owens, Wendt, Rabel and Kaelble (OWRK) method to determine the polar part and the disperse part of the surface energy. The same properties can be measured and calculated for photoresist layer 108.

In some cases, for positive tone photoresist, the polar part of surface energy of photoresist underlayer 106 can be between about 0 to about 15 mN/m. In accordance with further examples, the polar part of surface energy of photoresist underlayer 106 is within about −100% to about +60% of a value of a polar part of surface energy of the photoresist. The disperse part of the photoresist underlayer can be in the range of 20-35 mN/m.

FIG. 2 illustrates a structure 200, which can be formed by providing a mask overlying structure 100 and exposing the masked structure to extreme ultraviolet light (e.g., light having wavelengths between about 13.3 and 13.7 nm) to form exposed structures 202 and unexposed structures 204.

Figures 4, 5, 6:
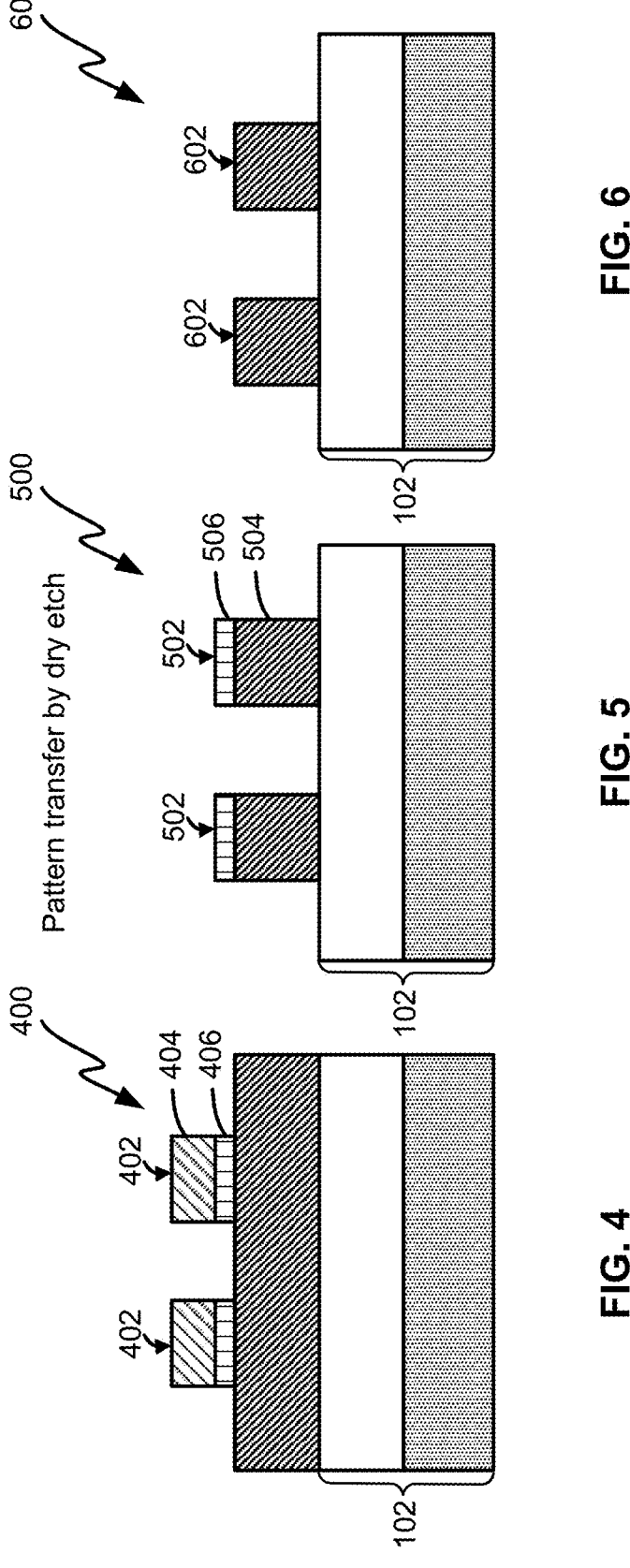

FIG. 3 illustrates a structure 300 after a development process to remove exposed structures 202. After the removal of structures 202, an etch process can be performed to remove sections of photoresist underlayer 106 and material layer 104 to form structures 400 and 500, illustrated in FIGS. 4 and 5. Structure 400 includes features 402, which can include photoresist material (section 404) and photoresist underlayer material (section 406). Structure 500 includes features 502 that include material layer 104 material (section 504) and photoresist underlayer material (section 506) and, in some cases, photoresist material. FIG. 6 illustrates structure 600, including structures 602 after photoresist underlayer and/or photoresist are removed from structure 500.

Photoresist layer 108 can be or include any suitable positive tone EUV photoresist material, such as chemically amplified resist (CAR). By way of examples, photoresist layer 108 is or includes Poly(4-hydroxystyrene) (PHS), styrene derivatives and acrylate copolymers. Photoacid generator (e.g. triphenylsulfonium triflate) and base quencher (amines or conjugated bases) might also be present in photoresist layer 108.

Figures 7, 8, 9:
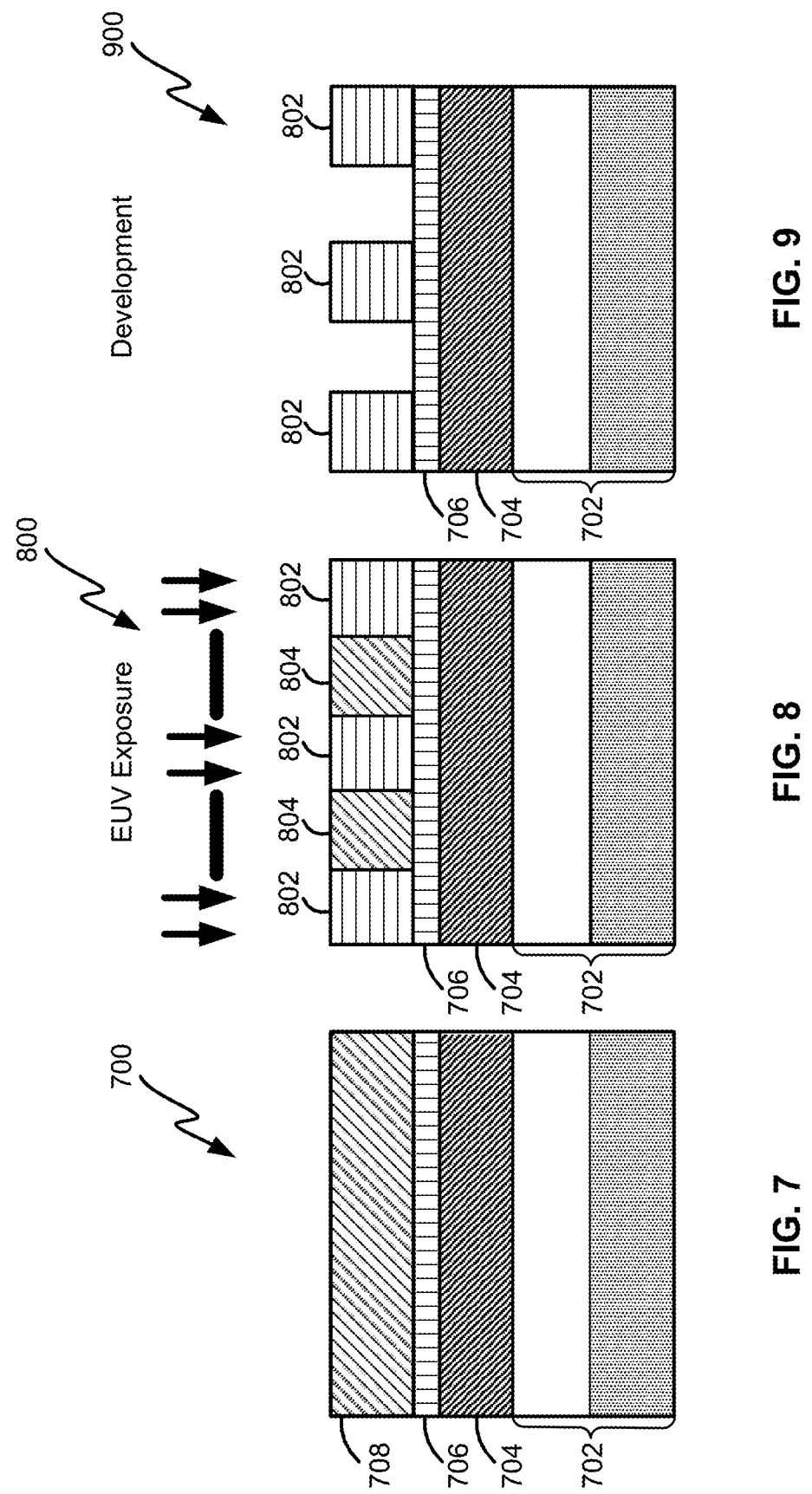

FIGS. 7-12 illustrate similar structures for negative tone photoresist. FIG. 7 illustrates a structure 700 that includes a substrate 702, a material layer 704, a photoresist underlayer 706, and a negative tone EUV photoresist layer 708.

Substrate 702 and material layer 704 can be the same or similar to substrate 102 and material layer 104 described above.

Similar to photoresist underlayer 106, photoresist underlayer 706 can include a photoresist underlayer formed in accordance with a method described herein and/or having properties as described herein. A thickness of photoresist underlayer 706 can depend on the thickness material layer 704 to be etched, a type of photoresist, and the like. In accordance with examples of the disclosure, photoresist underlayer 706 has a thickness under 10 nm less than or about equal to 5 nm.

Photoresist underlayer 706 can be formed of the same or similar materials described above in connection with photoresist underlayer 106. The surface of photoresist underlayer 706 may desirably be treated with a plasma treatment, as described below, to provide desired surface terminations to promote adhesion with negative tone photoresist layer 708. Alternatively, and in some embodiments, a plasma treatment may be used to reduce adhesion with a negative tone photoresist layer. In accordance with examples of the disclosure, photoresist underlayer 706 includes a surface comprising —$CH_x$, Si—H and/or OH terminated groups, the ratio of the groups can be fine-tuned to achieve desired surface chemistry properties or pattern profile with the target photoresist.

Photoresist underlayer 706 also desirably exhibits desired adhesion and other properties as described herein. To provide desired adhesion between photoresist layer 708 and photoresist underlayer 706, photoresist underlayer 706 may have or be tuned to have desired surface energy properties, i.e., a polar part of surface energy and a disperse part of surface energy. The polar part of surface energy and the disperse part of surface energy of photoresist underlayer 106 can be calculated by measuring a contact angle of a liquid, such as water or $CH_2I_2$, and using the Owens, Wendt, Rabel and Kaelble (OWRK) method to determine the polar part and the disperse part of the surface energy. The same properties can be measured and calculated for photoresist layer 708. In accordance with various examples of the disclosure, the polar part of surface energy of photoresist underlayer 706 is within about −20% to about +20% or about −10% to about +10% percent of a value of the respective polar part of surface energy of photoresist layer 708. The disperse part of the photoresist underlayer can be, for example, in the range of 20-35 mN/m.

Photoresist layer 708 can be or include any suitable negative tone EUV photoresist (e.g., CAR) material. By way of examples, photoresist layer 708 is or includes poly(4-hydroxystyrene) (PHS), styrene derivatives and acrylate copolymers. Photoacid generator (e.g. triphenylsulfonium triflate) and base quencher (amines or conjugated bases) might also be present in the photoresist layer 708.

Figures 10, 11, 12:
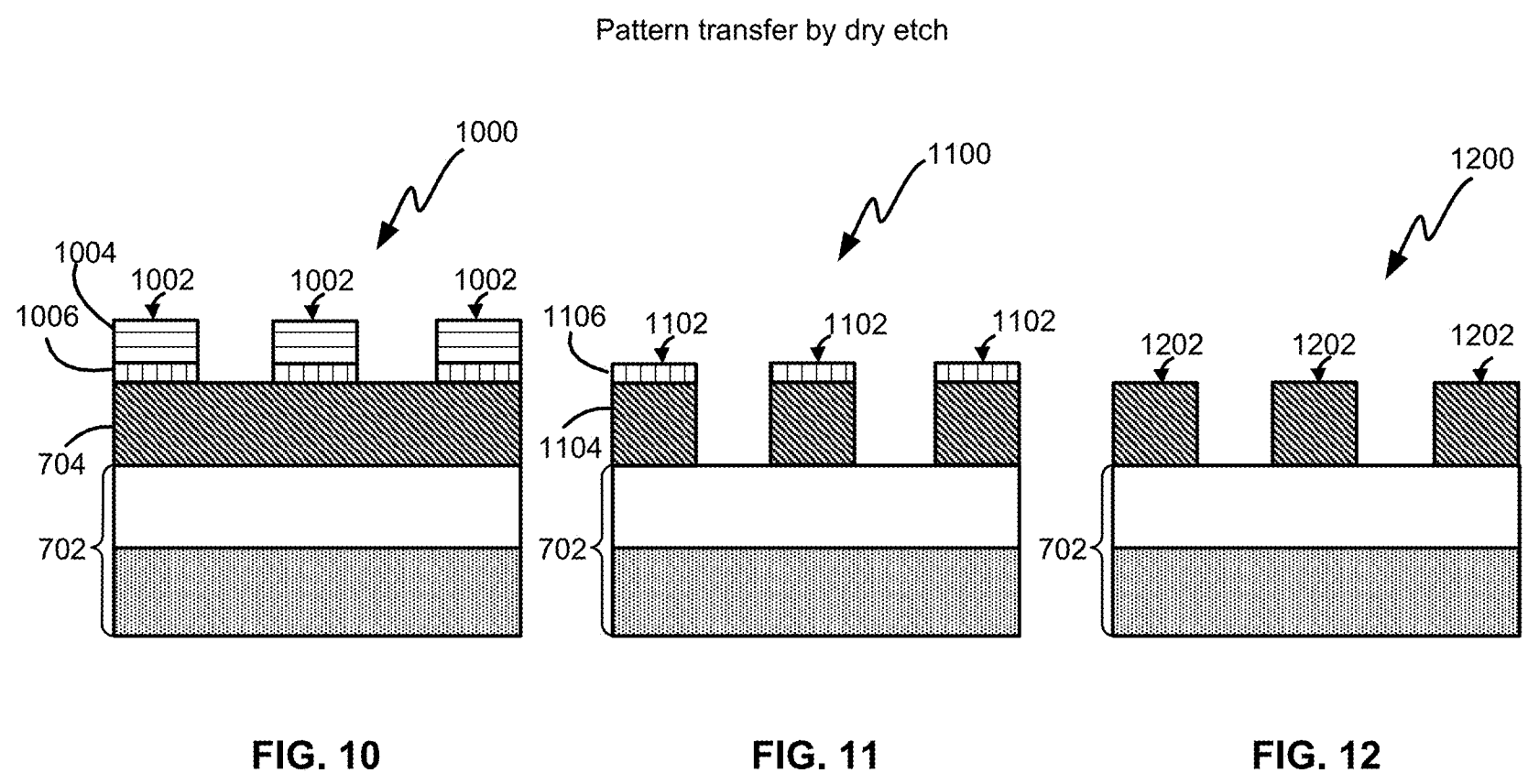

FIGS. 8-12 illustrate similar steps illustrated in FIGS. 2-6, except negative tone photoresist layer 708 is used rather than positive tone photoresist 108. FIG. 8 illustrates a structure 800, which can be formed by providing a mask overlying structure 700 and exposing the masked structure to EUV to form exposed structures 802 and unexposed structures 804. FIG. 9 illustrates a structure 900 after a development process to remove unexposed structures 804. After the removal of structures 804, an etch process can be performed to remove sections of photoresist underlayer 706 and material layer 704 to form structures 1000 and 1100, illustrated in FIGS. 10 and 11. Structure 1000 includes features 1002, which can include photoresist material (section 1004) and photoresist underlayer material (section 1006). Structure 1100 includes features 1102 that include material layer 704 material (section 1104) and photoresist underlayer material (section 1106) and, in some case photoresist material. FIG. 12 illustrates structure 1200, including structures 1202 after photoresist underlayer and/or photoresist are removed from structure 1100.

Figure 13:
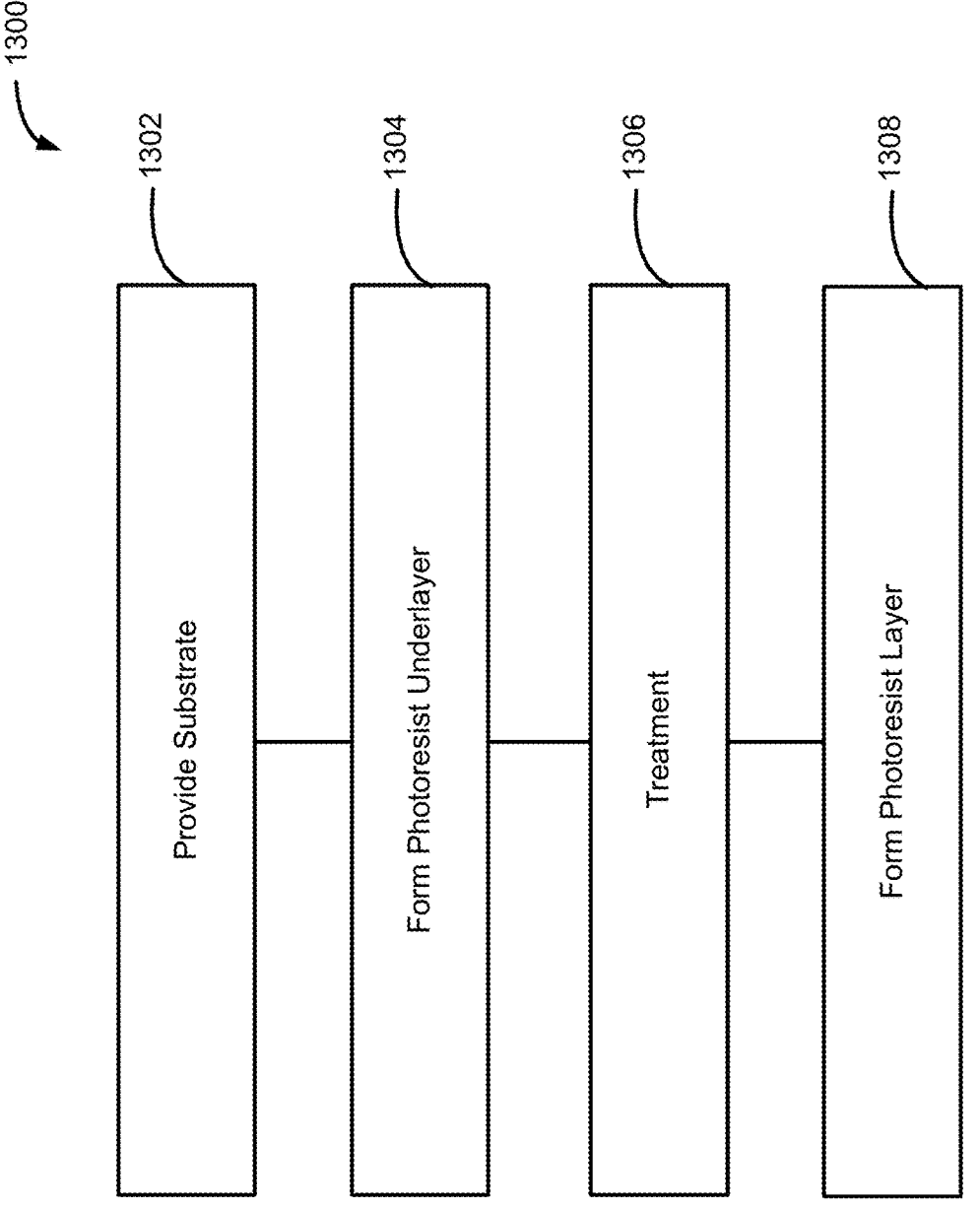
FIG. 13 illustrates a method of forming a structure in accordance with at least one embodiment of the disclosure.

Turning now to FIG. 13, a method 1300 of forming a structure in accordance with at least one embodiment of the disclosure is illustrated. Method 1300 includes the steps of providing a substrate (step 1302), forming a photoresist underlayer (step 1304), a treatment (step 1306), and forming a layer of photoresist (step 1308). In some cases, treatment step 1306 can be optional.

Step 1302 can include providing a substrate, such as a substrate described herein. The substrate can include a layer, such as a material layer described above for pattern transfer. By way of examples, the substrate can include a deposited oxide, a native oxide, or an amorphous carbon layer.

During step 1304, the photoresist underlayer can be formed using one or more of a plasma-enhanced cyclic deposition process, such as plasma-enhanced atomic layer deposition (PEALD), and plasma-enhanced chemical vapor deposition (PECVD). The term "cyclic deposition process" may refer to the sequential introduction of precursors (reactants) into a reaction chamber to deposit a layer over a substrate and includes processing techniques such as atomic layer deposition and cyclical chemical vapor deposition. The term "atomic layer deposition" (ALD) may refer to a vapor deposition process in which deposition cycles, typically a plurality of consecutive deposition cycles, are conducted in a process chamber. Generally, during each cycle, a precursor is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a co-reactant (e.g., another precursor or reaction gas) may subsequently be introduced into the process chamber for use in converting the chemisorbed precursor to the desired material on the deposition surface. The co-reactant can be capable of further reaction with the precursor. Further, purging steps can also be utilized during each cycle to remove excess precursor from the process chamber and/or remove excess co-reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Using one or more of plasma-enhanced cyclic (e.g., PEALD) or PECVD during step 1304 allows for formation of the photoresist underlayer with desired thickness—e.g., less than 10 nm or less than or about equal to 5 nm, with improved thickness uniformity—both within a substrate and from substrate-to-substrate. In addition, use of plasma-assisted processes allows for deposition of the photoresist underlayer material at relatively low temperatures—e.g., less than 500° C., less than 400° C. or between about 100° C. and about 500° C., or about 150° C. and about 450° C. A pressure within the reaction chamber can be about 1 to about 30, about 3 to about 23, or about 5 to about 20 Torr.

In some cases, PEALD may be preferred over PECVD, because PEALD can allow for better control of thickness, roughness, and uniformity of deposited material, which can be important for, for example, photoresist underlayers having a thickness of 5 nm or less. Underlayers having a thickness of 5 nm or less may be desirable, for example, because of compatibility with low etch budgets. And, PEALD processes may be performed at lower temperatures—compared to similar PECVD processes.

Note that in some embodiments, the term "PEALD" may refer to cyclic deposition processes in which one or more reagents are provided in pulses, i.e. intermittently. The steps in PEALD processes may not necessarily be self-limiting. In some embodiments though, a PEALD process comprises one or more self-limiting steps. Optionally, all steps in a PEALD process are self-limiting. An example of a cyclic PECVD process includes a plasma-assisted process in which one reagent is continuously provided to a reaction chamber while another reagent is provided to the reaction chamber in a plurality of pulses.

Step 1304 can be performed in a reactor. Exemplary reactors suitable for performing step 1304 are commercially available from ASM International NV (Almere, The Netherlands).

Precursors, also sometimes referred to herein as reactants, for step 1304 can include oxygen, silicon, hydrogen, and at least one organic group. In accordance with these examples, the precursor can include at least one silicon-oxygen bond. Additionally or alternatively, the precursor can include at least one silicon-R bond, wherein R is selected from one or more of the group consisting of alkyl, alkenyl, alkynyl, aryl, alkoxy, halogen, and hydrogen. In some cases, the at least one organic group comprises at least two organic groups.

By way of particular examples, the precursor can include one or more selected from the group consisting of: dimethyldimethoxysilane, dimethoxytetramethyldisiloxane, octamethylcyclotetrasiloxane, octadecyltrichlorosilane (OTS), tetramethylcyclotetrasiloxane (TMCTS), trimethylsilane (3MS), and diethoxymethylsilane (DEMS). Other exemplary precursors can include one or more of trimethylsilaneacetylene (TMSA), bis(trimethylsilyl)acetylene, (BTMSA), propargyltrimethylsilane (PTMS), propargyloxytrimethylsilane (POTMS), 1,3-diethynyltetramethyldisiloxane (DTDS), dimethylmethoxysilaneacetylene (DMMOSA), methyldimethoxysilaneacetylene (MDMOSA), dimethylethoxysilaneacetylene (DMEOSA), methyldiethoxysilaneacetylene (MDEOSA), ethyldiethoxysilaneacetylene (EDEOSA), dimethylsilane-diacetylene DMSDA, methylsilane-triacetylene (MSTA), tetraacetylenesilane (TAS), tetraethoxysilane (TEOS), tetramethoxysilane, dimethylethoxysilane, methoxytrimethylsilane, methyltrimethoxysilane, tetramethoxysilane, methoxydimethylvinylsilane, trimethoxyvinylsilane, ethoxytrimethylsilane, ethyltrimethoxysilane, ethoxydimethylvinylsilane, diethoxydimethylsilane, diethoxymethylvinylsilane, methyltriethoxysilane, diethoxydivinylsilane, triethoxyvinylsilane, diethoxydiethylsilane, ethyltriethoxysilane, tetraethoxysilane, dimethyldipropoxysilane, hexyltrimethoxysilane, hexyloxytrimethylsilane, pentyltriethoxysilane, 1,1,3,3-tetra methyldisiloxane, pentamethyldisiloxane, hexamethyldisloxane, 1,3-divinyl-1, 1,3,3-tetra methyldisiloxane, hexaethyldisiloxane, 1,3-dibutyl-1,1,3,3-tetra methyldisiloxane, hexamethylcyclotrisiloxane, 1,1,3,3,5,5-hexamethyltrisiloxane, hexaethylcyclotrisiloxane, 1,3,5-trimethyl-1,3,5-trivinylcyclotrisiloxane, 1,3,5,7-tetramethyl-1,3,5,7-tetravinylcyclotetrasiloxane, 1,3,5,7-tetraethoxy-1,3,5,7-tetramethylcyclotetrasiloxane, 1,3,5,7,9-pentamethylcyclopentasiloxane, decamethylcyclopentasiloxane, 1,3,5,7,9-pentaethoxy-1,3, 5,7,9-pentamethylcyclopentasiloxane, dodecamethylcyclohexasiloxane, other silane-containing precursors having methyl groups, and the like.

A reactant (or co-reactant) used in a PECVD or plasma-enhanced cyclic deposition (e.g., PEALD) process can include one or more of the group consisting of: Ar, He, $O_2$, $CO_2$, CO, $H_2$, $N_2O$, $H_2O$, $N_2$, $NH_3$. In the case of cyclic processes, such as PEALD, the reactant is provided in a separate pulse from the precursor. In the case of PECVD, the precursor and the co-reactant can be co-flowed into a reaction space.

Step 1306 can be used to tune a surface of a photoresist underlayer to modify a surface of the photoresist underlayer. For example, when starting with a C—H terminated surface, a disperse part of surface energy can be reduced by, for example, creating C—F terminated groups, increased by creating additional C—Cl terminated groups (e.g., using activated species generated from one or more halogen-containing gases), and a polar part can be increased by increasing a number of C—O terminated groups. For example, C—Cl terminated groups may be obtained by application of a chlorine-containing plasma, such as a plasma that is formed from a gas mixture comprising $Cl_2$. For example, C—F terminated groups may be obtained by application of a fluorine-containing plasma, for example a plasma that is formed from a gas mixture comprising $CF_4$. For example, treatment with ozone can be used to increase a polar part of the surface energy of the photoresist underlayer. A treatment with ozone may also increase the amount of carbon-oxygen containing groups at the underlayer surface. For example, a treatment with UV radiation and ozone may be used to increase the polar part of the surface energy of the photoresist underlayer. For example, treatment with a hydrogen-containing plasma, i.e. a plasma employing a plasma gas that comprises Hz, can be used to increase the amount of C—H surface terminations. For example, a treatment with a nitrogen-containing plasma can be used to increase the amount of C—N surface terminations. It shall be understood that in some embodiments, treatment step 1306 may be performed using a plasma comprising a plurality of the aforementioned species, thus yielding a surface comprising a variety of the aforementioned surface terminations. When used, treatment step 1306 may be performed in the same reaction chamber used to perform step 1304. It shall be understood that the aforementioned plasma treatments are effective means for controlling the surface energy of photoresist underlayers, and may additionally offer various advantages such as minimization of etch rate and/or thickness loss during plasma treatment.

Treatment step 1306 may be particularly desirable for use with negative tone EUV photoresist layers. In some cases, for negative tone photoresist, it may be desirable to treat a hydrophobic surface to make the surface more hydrophilic. In this case, a surface of the photoresist underlayer can be treated with activated species that can be produced from a direct or remote plasma formed, at least in part, from one or more gases selected from the group consisting of Hz, $O_2$, $CO_2$, CO, $N_2O$, $NF_3$, $C_xH_yF_z$ (x>=1, y>=0, z>=0). For positive tone photoresist, a surface of the photoresist underlayer could be treated with, for example, activated species that can be produced from a direct or remote plasma formed, at least in part, from one or more gases selected from the group consisting of Hz, $O_2$, $CO_2$, CO, $N_2O$, $NF_3$, $C_xH_yF_z$ (x>=1, y>=0, z>=0). However, in some cases, no surface treatment may be performed on the photoresist underlayer when positive tone photoresist is used. A plasma power applied during step 1306 can range from about 50 to about 350 W for direct plasma and from about 500 to about 2500 W for a remote plasma.

Figure 14:
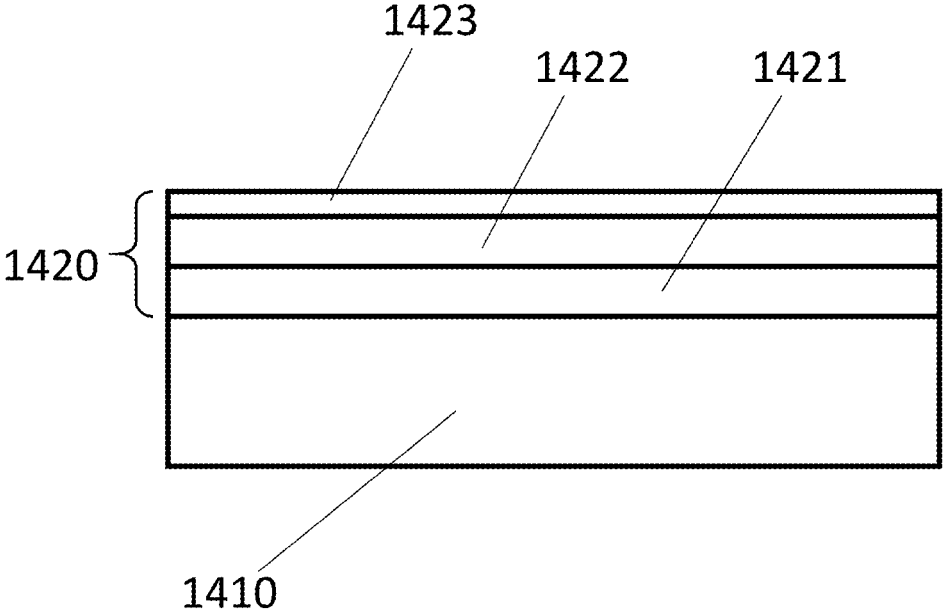
FIG. 14 illustrates an underlayer in accordance with at least one embodiment of the disclosure. Throughout FIG. 14, the following numbering is adhered to: 1410—substrate; 1420—underlayer; 1421—lower underlayer part; 1422—upper underlayer part.

As shown in FIG. 14, an underlayer (1420) as described herein may comprise a bi-layer structure comprising an upper underlayer part (1422) and a lower underlayer part (1421). The lower underlayer part (1421) may comprise a metal or metalloid. Suitable metals may include Ti, V, Cr, Mv, Fe, Co, Ni, Cu, Zr, Mo, Ru, Hf, Ta, and W. Suitable metalloids may include B, Si, Ge, As, Sb, and Te. The lower underlayer part (1421) may be used, for example, as a layer offering etch selectivity. The upper underlayer part (1422) may be used for example, as an adhesion layer and/or as a developer blocking layer, i.e. as a layer that protects underlying layers against developer. Thus, the underlayer of FIG. 14 offers simultaneous good adhesion and etch resistance by employing an etch resistant lower underlayer part (1421) and an adhering and developer-blocking upper underlayer part (1422). The lower underlayer part (1421) and the upper underlayer part (1422) may be deposited in one and the same reactor chamber. Alternatively, the lower underlayer part (1421) and the upper underlayer part (1422) may be deposited in different reactor chambers. The different reactor chambers are preferably comprised in a single cluster tool, the cluster tool comprising two or more reactor chambers and a wafer transfer module arranged for transporting substrates from one reactor chamber to another.

In some embodiments, an inorganic hardmask may be used as a lower underlayer part (1421). The inorganic hardmask may be deposited, for example, by means of thermal atomic layer deposition (ALD) or plasma-enhanced atomic layer deposition (PEALD). In some embodiments, the inorganic hardmask comprises a material selected from the list consisting of silicon oxide, aluminum oxide, and titanium oxide. In some embodiments the inorganic hardmask comprises a metalloid such as B, Si, Ge, As, Sb, or Te. Suitable metalloid-containing layers include $SiO_2$ and SiOC. In some embodiments the inorganic hardmask comprises an oxide and/or a nitride of a metal, e.g. a metal selected from the list consisting of Ti, Sr, Zn, Al, Ta, and Sn.

In some embodiments, the lower underlayer part (1421) comprises one or more dopants. Suitable dopants include Cd, Ag, In, Sb, Sn I, Te, and Cs. Without the present invention being bound to theory or any particular mode of operation, it is believed that these increase dose-to-size by means of their sensitivity to EUV light, i.e. due to their large atomic cross section for extreme ultraviolet photons.

In some embodiments, a low-k material may be used as an upper underlayer part (1422). Suitable low-k materials include SiOC films and layers comprising SiOCH, and/or SiOCNH, as disclosed herein. Non-porous low-k materials may be especially suitable. In some embodiments, amorphous carbon may be used as an upper underlayer part (1422).

In some embodiments, the upper underlayer part (1422) comprises a functionalized surface (1423). The functionalized surface may comprise, for example, H, $CH_3$, and/or OH functional groups. These surface functional groups may be applied, for example, by means of a plasma treatment as described herein. Additionally or alternatively, the surface functional groups may be applied by means of self-assembled monolayers (SAMs).

Although not illustrated, methods in accordance with the disclosure can include determining surface energy properties of a photoresist underlayer and/or a photoresist layer. For example, methods can include determining one or more of a disperse part and a polar part of surface energy of one or both of a photoresist layer and a photoresist underlayer. Methods can further include selecting photoresist underlayer material based on one or more of a disperse part and a polar part of surface energy of the photoresist layer and/or tuning one or more of a disperse part and a polar part of surface energy of the photoresist underlayer—e.g., using a plasma treatment process as described herein.

In some embodiments, such underlayers may be deposited by means of a cyclical deposition process. Such cyclical deposition processes may be especially suitable for the deposition of SiOC-containing layers. Suitably, the cyclical deposition process employs a plasma. Plasma power and plasma gas flow may be suitably maintained at a predetermined level throughout the cyclical deposition process. Suitable plasma gasses include He, Ar, Hz, and mixtures thereof. In the cyclical deposition process, one or more precursors are provided in pulses, i.e. intermittently. Suitable precursors include the precursors mentioned elsewhere herein. The pulses may last from at least 0.01 s to at most 2.0 s, or from at least 0.02 s to at most 1.0 s, or from at least 0.05 s to at most 0.5 s, or from at least 0.1 s to at most 0.2 s. Particularly suitable precursors include dimethyldimethoxysilane, dimethyldiethoxysilane; octamethylcyclotetrasiloxane; and 3-(Methoxy)propyltrimethoxysilane. The use of such precursors may result in the deposition of SiOC layers. The plasma power used may be, for example, from at least 20 W to at most 200 W, or from at least 30 W to at most 150 W, or from at least 50 W to at most 100 W. Such pulsed deposition processes allow for a low growth per cycle, which allows uniformly growing very thin films, such as films with a thickness of at least 0.5 nm to at most 5.0 nm, or of at least 1.0 nm to at most 2.0 nm. In addition, the films offer very good uniformity, e.g. 3sigma (i.e. 3 times thickness standard deviation) less than 2 nm. Also, the deposition processes create few particles, e.g. less than 50 particles. Furthermore, the process allows for easy control of the underlayer's surface energy, e.g. for controlling the dispersive part of the surface energy in the range of 20 to 40 mN/m, and controlling the polar part of the surface energy in the range of 0 to 40 mN/m. Additionally, this process allows to provide underlayers with good etch contrast against e.g. photoresist. Underlayers grown using pulsed precursor flow can be used for various applications as described herein. For example, they can be used as underlayer on their own. Alternatively, they may be used as an adhesion layer between a lower-lying layer and a photoresist, e.g., such as the upper underlayer part (1422) is used as described elsewhere herein. Optionally, the underlayer formed using a pulsed deposition process may be subjected to a surface-modifying plasma treatment using methods as described herein. This may further enhance adhesion between the underlayer and a photoresist layer.

Figure 15:
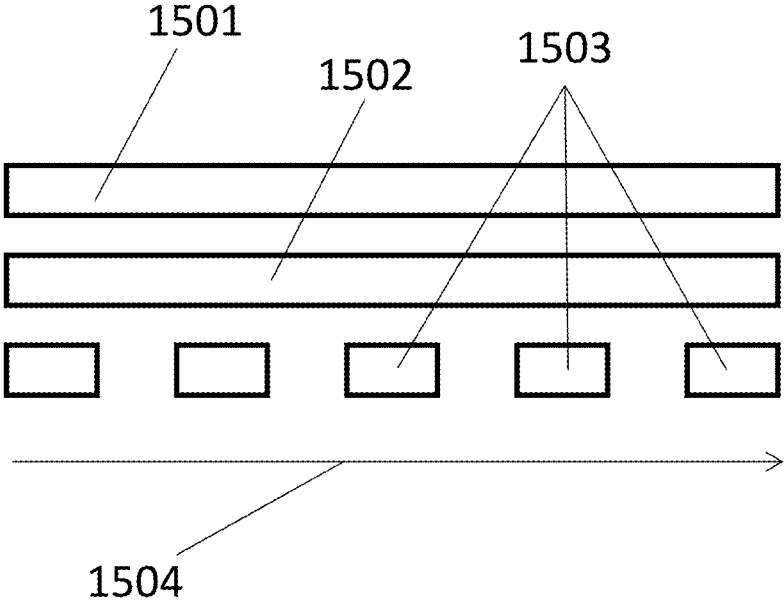
FIG. 15 illustrates a pulsing regime of a method in accordance with at least one embodiment of the disclosure. Throughout FIG. 15, the following numbering is adhered to: 1501—plasma power; 1502—plasma gas flow; 1503—precursor flow; 1504—timeline.

An exemplary cyclical deposition process for forming an underlayer is described in FIG. 15. In particular, FIG. 15 shows plasma power (1501) always on, and a continuous plasma gas flow (1502). Precursor flow (1503) is provided in pulses. Optionally, the precursor pulses are separated by purges (not shown). A timeline (1504) indicates the flow of time from left to right. Below, exemplary process conditions are provided for 300 mm wafers. It shall be understood that they can be readily transferred to other wafer sizes without having to resort to inventive skill.

The cyclical deposition process may, for example, employ dimethyldimethoxysilane as a precursor and an argon/hydrogen plasma. Reactor pressure may suitably be from 200 Pa to 400 Pa. Argon flow rate may be from 1 to 5 slm (standard liters per minute). The hydrogen flow rate may be from at least 0.1 slm to at most 0.2 slm. Plasma power can be about 50 W. Precursor pulse time can be from at least 0.1 s to at most 0.5 s. The pulses may be separated by purges. The purge gas may, for example, be H, a noble gas, or a mixture thereof. Suitable noble gases include He, Ne, Ar, Xe, and Kr. Purge time may be from 0.1 s to 2.0 s. The reactor temperature may be from at least 50° C. to at most 200° C., e.g. a temperature of from at least 75° C. to at most 150° C. A seal gas such as helium may be used, for example with a seal gas flow of at least 0.2 slm to at most 1.0 slm. The seal gas may be suitably provided to prevent deposition under a substrate such as a silicon wafer. Such a process can yield a growth per cycle of 0.05 nm, and offer a thickness standard deviation of less than 0.15 nm. The surface energy may be adequately controlled as desired in this process range, with a dispersive part of from at least 26 mN/m to at most 31 mN/m, and a polar part of the surface energy of from at least 3 mN/m to at most 13 mN/m.

In another exemplary embodiment, the cyclic deposition process may employ octamethylcyclotetrasiloxane (OMCTS) as a precursor and a mixture of Ar and $H_2$ as plasma gas. The reactor pressure may be from at least 100 Pa to at most 400 Pa, for example from at least 200 Pa to at most 300 Pa. The argon flow rate may be from at least 2.0 slm to at most 6.0 slm. Plasma power may be from at least 40 W to at most 200 W, e.g. about 50 W. $H_2$ flow rate may be from at least 0.1 slm to at most 2.0 slm. The reactor temperature may be from at least 50° C. to at most 200° C., for example from at least 75° C. to at most 150° C. The precursor is provided to the reactor in pulses. Precursor pulse time can be from at least 0.1 s to at most 0.3 s. The pulses may be separated by purges. Purge time may be from at least 0.0.5 s to at most 4.0 s, e.g. from at least 0.1 s to at most 2.0 s. Such a process may offer a growth rate of 0.1 nm per cycle and a thickness standard deviation of just 0.1 nm. The surface energy may be adequately controlled as desired in this process range, with a dispersive part of from at least 26 mN/m to at most 30 mN/m, and a polar part of the surface energy of from at least 2 mN/m to at most 13 mN/m.

Without the invention being bound by any theory or mode of operation, it is believed that the above large polar surface energy parts allow decreasing the required amount of EUV radiation, and it also provides an improved contrast curve. This is shown in FIG. 16. In particular, FIG. 16 panel a) shows the required EUV dose for full development as a function of the polar part of the surface energy of the underlayer: the required EUV dose decreases monotonically with polar part of the surface energy of the underlayer. Panel b) shows a developed underlayer-resist stack of which the underlayer has a relatively low polar part of the surface energy, which features imperfect development. Panel c) shows a developed underlayer-resist stack of which the underlayer has a relatively high polar part of the surface energy, which results in improved development.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

What is claimed is:

1. A method including a pre-treatment for a photoresist deposition step, the method comprising the steps:

providing a substrate to a reaction chamber, the substrate comprising a top material layer comprising amorphous carbon or spin on carbon or a self-assembled monolayer;

using a plasma-enhanced cyclic process, depositing an underlayer having a thickness of less than 5 nm directly on the top material layer;

forming a photoresist layer adhered and in direct contact with the underlayer; and removing all of the underlayer material remaining after etching the top material layer, wherein the underlayer has a surface energy having a polar part and a dispersive part, wherein polar part of the surface energy is from at least 3 mN/m to at most 13 mN/m.

2. The method according to claim 1 wherein the dispersive part of the surface energy is from at least from at least 26 mN/m to at most 31 mN/m.

3. The method according to claim 1 wherein the dispersive and polar parts of the surface energy are determined by means of an Owens, Wendt, Rabel and Kaelble (OWRK) method.

4. The method according to claim 1 wherein the underlayer comprises silicon, oxygen, hydrogen, and carbon.

5. The method according to claim 4 wherein the underlayer further comprises nitrogen.

6. The method according to claim 1 wherein the method further comprises, after the step of depositing the underlayer having a thickness of less than 5 nm on the substrate, and prior to the step of forming a photoresist layer, a step of exposing the underlayer to a plasma, the plasma comprising one or more elements selected from the list consisting of chlorine, fluorine, oxygen, hydrogen, and nitrogen to modify adhesion between the underlayer and the photoresist layer.

7. The method according to claim 6 wherein the plasma is formed using one or more of $Cl_2$, $CF_4$, $O_2$, $CO_2$, CO, $N_2O$, $NF_3$, $C_xH_yF_z$ (x>=1,y>=0,z>=0).

8. The method according to claim 7 wherein the precursor is provided in pulses and wherein a plasma power is continuously provided through the plasma- enhanced cyclic process.

9. The method according to claim 1 wherein a precursor provided during the plasma-enhanced cyclic process is selected from the list consisting of dimethyldimethoxysilane, dimethoxytetramethyldisiloxane, octamethylcyclotetrasiloxane (OMCTS), tetramethylcyclotetrasiloxane (TMCTS), trimethylsilane (3MS), and diethoxymethylsilane (DEMS).

10. The method according to claim 1 wherein a plasma formed during the plasma-enhanced cyclic process comprises a noble gas.

11. The method according to claim 1 wherein the method further comprises, after the step of depositing the underlayer having a thickness of less than 5 nm on the substrate, and prior to the step of forming a photoresist layer, a step of exposing the underlayer to a remote plasma treatment.

12. A method of forming a structure, the method comprising the steps of:

providing a substrate;

forming a photoresist underlayer directly overlying a material layer on a surface of the substrate;

forming a photoresist layer overlying and adhered to and in direct contact with the photoresist underlayer; and removing all of the underlayer material remaining after etching the material layer, wherein the photoresist underlayer is formed using one or more of plasma-enhanced atomic layer deposition and plasma-enhanced chemical vapor deposition;

wherein the photoresist underlayer comprises a bilayer comprising a lower underlayer part and an upper underlayer part, the lower underlayer part comprising V, Cr, Mv, Fe, Co, Ni, Cu, Zr, Mo, Ru, Hf, Ta, W, B, Ge, As, Sb, or Te, or an oxide of Ti, Sr, Zn, Al, Ta, or Sn, or a nitride of Sr, Zn, Al, and Sn, and/or comprises a dopant selected from Cd, Ag, In, Sb, Sn I, Te, and Cs, and the upper underlayer part comprising silicon, oxygen, and carbon;

wherein the photoresist layer comprises extreme ultraviolet (EUV) lithography photoresist; and, wherein a thickness of the photoresist underlayer is less than 5 nm.

13. The method of claim 12, wherein the step of forming the photoresist underlayer comprises providing a precursor comprising oxygen, silicon, hydrogen, and at least one organic group;

wherein the precursor comprises at least one silicon-oxygen bond; and, wherein the precursor comprises at least one silicon-R bond, wherein R is selected from one or more of the group consisting of an alkyl, alkenyl, alkynyl, aryl, alkoxy, halogen, and hydrogen.

14. The method of claim 13, wherein the precursor comprises one or more selected from the group consisting of: dimethyldimethoxysilane, dimethoxytetramethyldisiloxane, and octamethylcyclotetrasiloxane, tetramethylcyclotetrasiloxane (TMCTS), trimethylsilane (3 MS), and diethoxymethylsilane (DEMS).

15. The method of claim 12, wherein the step of forming the photoresist underlayer comprises providing one or more of a reactant and a co-reactant selected from one or more from the group consisting of: Ar, He, $O_2$, $CO_2$, CO, $H_2$, $N_2O$, $H_2O$, $N_2$, $NH_3$.

16. The method of claim 12, further comprising a step of determining a polar part of surface energy of the photoresist underlayer and a dispersive part of surface energy of the photoresist underlayer, wherein the photoresist layer comprises positive tone photoresist and a value of the polar part of surface energy of the photoresist underlayer is from at least 3 mN/m to at most 13 mN/m and a value of a dispersive part of the photoresist underlayer is from at least 26 mN/m to at most 31 mN/m.

17. The method of claim 12, further comprising a step of determining a polar part of surface energy of the photoresist underlayer, wherein the photoresist layer comprises negative tone photoresist and a value of the polar part of surface energy of the photoresist underlayer is within about −20% to about +20% percent of a value of a polar part of surface energy of the photoresist layer.

18. The method of claim 12, further comprising, after the step of forming the photoresist underlayer, a step of exposing the photoresist underlayer to a plasma treatment step to manipulate adhesion between the photoresist underlayer and the photoresist layer.

19. The method of claim 18, wherein the plasma treatment step comprises forming activated species from one or more of $O_2$, $CO_2$, CO, $N_2O$, $NF_3$, $C_xH_yF_z$ (x>=1,y>=0,z>=0).

20. The method of claim 12, wherein the lower underlayer part comprises V, Cr, Mv, Fe, Co, Ni, Cu, Zr, Mo, Ru, Hf, Ta, W, B, Ge, As, Sb, or Te, or an oxide of Ti, Sr, Zn, Al, Ta, or Sn, and/or comprises a dopant selected from Cd, Ag, In, Sb, Sn I, Te, and Cs.

* * * * *